(12) United States Patent
Katagiri et al.

(10) Patent No.: US 9,589,921 B2
(45) Date of Patent: Mar. 7, 2017

(54) SEMICONDUCTOR DEVICE

(71) Applicants: PS4 Luxco S.a.r.l., Luxembourg (LU); Mitsuaki Katagiri, Tokyo (JP); Yu Hasegawa, Tokyo (JP); Satoshi Isa, Tokyo (JP)

(72) Inventors: Mitsuaki Katagiri, Tokyo (JP); Yu Hasegawa, Tokyo (JP); Satoshi Isa, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/773,817

(22) PCT Filed: Mar. 10, 2014

(86) PCT No.: PCT/JP2014/056185
§ 371 (c)(1),
(2) Date: Sep. 9, 2015

(87) PCT Pub. No.: WO2014/142075
PCT Pub. Date: Sep. 18, 2014

(65) Prior Publication Data
US 2016/0027754 A1    Jan. 28, 2016

(30) Foreign Application Priority Data

Mar. 13, 2013 (JP) ................. 2013-050404

(51) Int. Cl.
*H01L 23/00* (2006.01)
*H01L 23/31* (2006.01)
(Continued)

(52) U.S. Cl.
CPC .............. *H01L 24/17* (2013.01); *H01L 23/12* (2013.01); *H01L 23/3107* (2013.01);
(Continued)

(58) Field of Classification Search
CPC ............... H01L 23/481; H01L 23/4824; H01L 23/49827; H01L 23/49816; H01L 24/13;
(Continued)

(56) References Cited

U.S. PATENT DOCUMENTS 7,078,792 B2 *   7/2006  Lam .................. H01L 23/49531
                                                           257/686
2004/0150118 A1 *  8/2004  Honda .................. H01L 21/563
                                                           257/778

FOREIGN PATENT DOCUMENTS

JP      03173434    7/1991
JP      03173435    7/1991
JP      10070158    3/1998

OTHER PUBLICATIONS

Application No. PCT/JP2014/056185, International Search Report, Jun. 10, 2014.

* cited by examiner

*Primary Examiner* — Jasmine Clark
(74) *Attorney, Agent, or Firm* — Kunzler Law Group, PC

(57) ABSTRACT

In one semiconductor device, a semiconductor chip has first and second pad electrodes disposed on the main surface thereof, insulating films that cover the main surface of the semiconductor chip, a rewiring layer that is disposed between the insulating films, and a plurality of external terminals disposed on the top of the insulating film. The plane size of the first pad electrode and the second pad electrode differ from one another, and the first pad electrode and the second pad electrode are connected to any of the plurality of external terminals via the rewiring layer.

13 Claims, 23 Drawing Sheets

(51) Int. Cl.
*H01L 23/48* (2006.01)
*H01L 23/498* (2006.01)
*H01L 25/065* (2006.01)
*H01L 23/12* (2006.01)
*H01L 21/56* (2006.01)
*H01L 21/66* (2006.01)
*H05K 1/02* (2006.01)
*H05K 1/14* (2006.01)
*H05K 1/18* (2006.01)

(52) U.S. Cl.
CPC ...... *H01L 23/481* (2013.01); *H01L 23/49816* (2013.01); *H01L 23/49838* (2013.01); *H01L 24/02* (2013.01); *H01L 24/05* (2013.01); *H01L 24/06* (2013.01); *H01L 24/11* (2013.01); *H01L 24/13* (2013.01); *H01L 24/14* (2013.01); *H01L 24/81* (2013.01); *H01L 25/0657* (2013.01); *H01L 21/561* (2013.01); *H01L 22/32* (2013.01); *H01L 23/3128* (2013.01); *H01L 24/03* (2013.01); *H01L 24/16* (2013.01); *H01L 24/32* (2013.01); *H01L 24/83* (2013.01); *H01L 24/94* (2013.01); *H01L 24/97* (2013.01); *H01L 2224/0235* (2013.01); *H01L 2224/02375* (2013.01); *H01L 2224/0345* (2013.01); *H01L 2224/03912* (2013.01); *H01L 2224/0401* (2013.01); *H01L 2224/05014* (2013.01); *H01L 2224/05015* (2013.01); *H01L 2224/05025* (2013.01); *H01L 2224/05166* (2013.01); *H01L 2224/05548* (2013.01); *H01L 2224/05554* (2013.01); *H01L 2224/05647* (2013.01); *H01L 2224/0603* (2013.01); *H01L 2224/06051* (2013.01); *H01L 2224/06102* (2013.01); *H01L 2224/11462* (2013.01); *H01L 2224/11472* (2013.01); *H01L 2224/11849* (2013.01); *H01L 2224/131* (2013.01); *H01L 2224/13006* (2013.01); *H01L 2224/13007* (2013.01); *H01L 2224/13013* (2013.01); *H01L 2224/13014* (2013.01); *H01L 2224/13017* (2013.01); *H01L 2224/13018* (2013.01); *H01L 2224/13024* (2013.01); *H01L 2224/13025* (2013.01); *H01L 2224/13028* (2013.01); *H01L 2224/13147* (2013.01); *H01L 2224/1403* (2013.01); *H01L 2224/1411* (2013.01); *H01L 2224/14051* (2013.01); *H01L 2224/14131* (2013.01); *H01L 2224/14135* (2013.01); *H01L 2224/14136* (2013.01); *H01L 2224/14177* (2013.01); *H01L 2224/14181* (2013.01); *H01L 2224/16145* (2013.01); *H01L 2224/16146* (2013.01); *H01L 2224/16148* (2013.01); *H01L 2224/16225* (2013.01); *H01L 2224/16227* (2013.01); *H01L 2224/16238* (2013.01); *H01L 2224/17181* (2013.01); *H01L 2224/17517* (2013.01); *H01L 2224/32145* (2013.01); *H01L 2224/32225* (2013.01); *H01L 2224/73204* (2013.01); *H01L 2224/81191* (2013.01); *H01L 2224/81193* (2013.01); *H01L 2224/81203* (2013.01); *H01L 2224/81801* (2013.01); *H01L 2224/83102* (2013.01); *H01L 2224/83862* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06596* (2013.01); *H01L 2924/15311* (2013.01); *H01L 2924/3011* (2013.01); *H01L 2924/3511* (2013.01); *H05K 1/025* (2013.01); *H05K 1/141* (2013.01); *H05K 1/185* (2013.01); *H05K 2201/10734* (2013.01)

(58) Field of Classification Search
CPC ... H01L 2224/0603; H01L 2224/49111; H01L 24/02; H01L 24/05; H01L 24/06; H01L 24/11; H01L 24/14; H01L 24/81; H01L 23/49838; H01L 24/16; H01L 24/97; H01L 2224/0401; H01L 2224/48247; H01L 21/563; H01L 23/485; H01L 2224/17104
See application file for complete search history.

SEMICONDUCTOR DEVICE

TECHNICAL FIELD

The present invention relates to a semiconductor device, and more particularly relates to a semiconductor device provided with a semiconductor chip and a wiring structure provided on a main surface thereof.

BACKGROUND

Many semiconductor devices are configured from a semiconductor chip and a package housing the chip. The package is provided with external terminals, and also with a wiring structure that connects pad electrodes provided on the semiconductor chip with the external terminals. In a normal package, a rigid package substrate made from resin or the like functions as the wiring structure (see Patent Document 1). Also, there are packages known as wafer level packages (WLP) in which a rigid substrate is not used, but the wiring structure is formed directly on the main surface of the semiconductor chip.

Patent Documents

Patent Document 1: Japanese Patent Application Laid-open No. 2012-33613.

DISCLOSURE OF THE INVENTION

Problem to be Solved by the Invention

In recent years with the higher speeds and higher performance of semiconductor chips such as Dynamic Random Access Memory (DRAM) and the like, the ability of the power supply voltage within the semiconductor chip has become more important than before. In order to stabilize the power supply voltage, the method of increasing the number of external terminals for the power supply can be considered, but in many cases the number and arrangement of external terminals is determined in advance by standards and the like, so it is difficult to freely increase the number of external terminals for power supply. Also, an effect cannot be expected when stabilizing internal power supply voltage that is different from an external power supply voltage supplied from the outside, even if the number of external terminals for power supply is increased.

Therefore, to increase the stability of the power supply voltage, it is necessary to reduce the impedance of the power supply wiring, but to reduce the impedance it is possible to consider forming the cross-sectional area of the wiring for the power supply thicker, or increasing the number of wiring layers for power supply, in other words, increasing the number of layers in the wiring layer formed in the semiconductor chip to increase the wiring layer for the power supply. However, to form the wiring for power supply thicker it is necessary to change the semiconductor chip manufacturing process in order to form the conductors thicker, and to increase the number of layers in the wiring layer it is necessary to form a new mask pattern, which is not practical from the cost point of view.

Means for Solving the Problem

The semiconductor device according to the present invention includes: a semiconductor chip that includes a plurality of first pad electrodes and a plurality of second pad electrodes; and a wiring structure provided on the semiconductor chip, characterized in that the wiring structure includes a plurality of external terminals, a plurality of wiring patterns that electrically connect the plurality of external terminals and the plurality of first pad electrodes, and bridge wiring that is not electrically connected to any of the plurality of external terminals within the wiring structure, but that electrically connects in a shared fashion the plurality of second pad electrodes.

Effect of the Invention

According to the present invention, the bridge wiring provided in the wiring structure supplements the wiring within the semiconductor chip, so it is possible to reduce the impedance of specific wiring.

BRIEF DESCRIPTION OF THE DRAWINGS

FIG. 25 is a schematic plan view for describing an example of the bumps 170c on the reverse surface of the semiconductor chip 100b short-circuited by the bridge wiring 290a;

BEST MODE FOR CARRYING OUT THE INVENTION

The following is a detailed description of the best mode for carrying out the present invention, with reference to the attached drawings.

Figure 1:
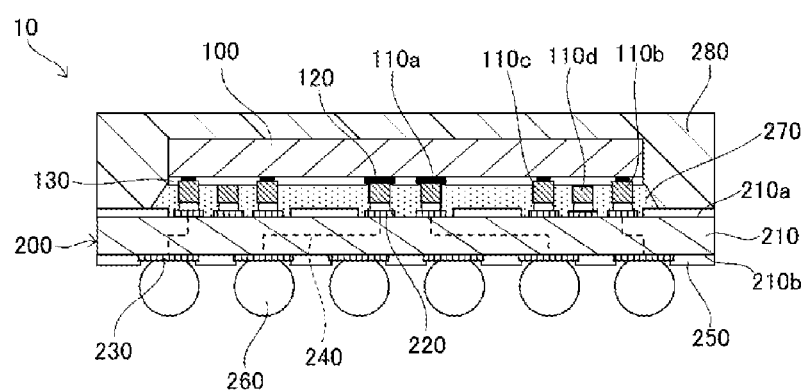
FIG. 1 is a schematic cross-sectional view for describing the structure of a semiconductor device 10 according to a first embodiment of the present invention.

FIG. 1 is a schematic cross-sectional view for describing the structure of a semiconductor device 10 according to a first embodiment of the present invention.

As shown in FIG. 1, the semiconductor device according to the present embodiment includes a semiconductor chip 100, and a wiring substrate 200 on which the semiconductor chip 100 is flip chip mounted. The semiconductor chip 100 is a single-chip device in which a plurality of elements such as transistors and the like are provided on a semiconductor substrate made from silicon (Si) or the like. There is no particular limitation on the type of semiconductor chip 100, and it may be a memory device such as a Dynamic Random Access Memory (DRAM) or the like, or a logic type device such as a Central Processing Unit (CPU) or the like, or an analog type device such as a sensor or the like.

The wiring substrate 200 is a circuit board that functions as a wiring structure, and includes for example an insulating substrate 210 made from glass epoxy 0.2 mm thick, connecting electrodes 220 formed on a first surface 210a of the insulating substrate 210, and a land pattern 230 formed on a second surface 210b of the insulating substrate 210. The connecting electrodes 220 and the land pattern 230 are connected together via a wiring pattern 240 provided on the insulating substrate 210. The wiring pattern 240 may be formed on either the first or the second surface of the insulating substrate 210, or may be formed in an internal layer of the insulating substrate 210. The parts where the connecting electrodes 220 and the land pattern 230 are not formed on the first and the second surfaces of the insulating substrate 210 are covered with a solder resist 250. The connecting electrodes 220 are electrodes to which bump electrodes 110 provided on the semiconductor chip 100 are joined. Also, external terminals 260 made from solder balls are connected to the land pattern 230. Underfill 270 is filled between the wiring substrate 200 and the semiconductor chip 100, and sealing resin 280 is provided covering the semiconductor chip 100.

In the present embodiment, four types of bump electrode 110 are provided in the semiconductor chip 100. The first type of bump electrode 110a is provided in substantially the center region of the semiconductor chip 100, electrically connected to the external terminals 260 via the wiring pattern 240. The second type of bump electrode 110b is provided in the vicinity of the outer peripheral region of the semiconductor chip 100, electrically connected to the external terminals 260 via the wiring pattern 240. The third type of bump electrode 110c is provided in the vicinity of the outer peripheral region of the semiconductor chip 100, but is not electrically connected to any of the external terminals 260. The fourth type of bump electrode 110d is a dummy bump electrode provided in the vicinity of the outer peripheral region of the semiconductor chip 100, and is not electrically connected to any of the external terminals 260. As shown in FIG. 1, the pad electrodes 120 are provided at the base of the bump electrodes 110a to 110c, but pad electrodes are not provided corresponding to the dummy bump electrodes 110d, which are formed on the top surface of a protective film 130 that covers the surface layer of the semiconductor chip 100.

Figure 2:
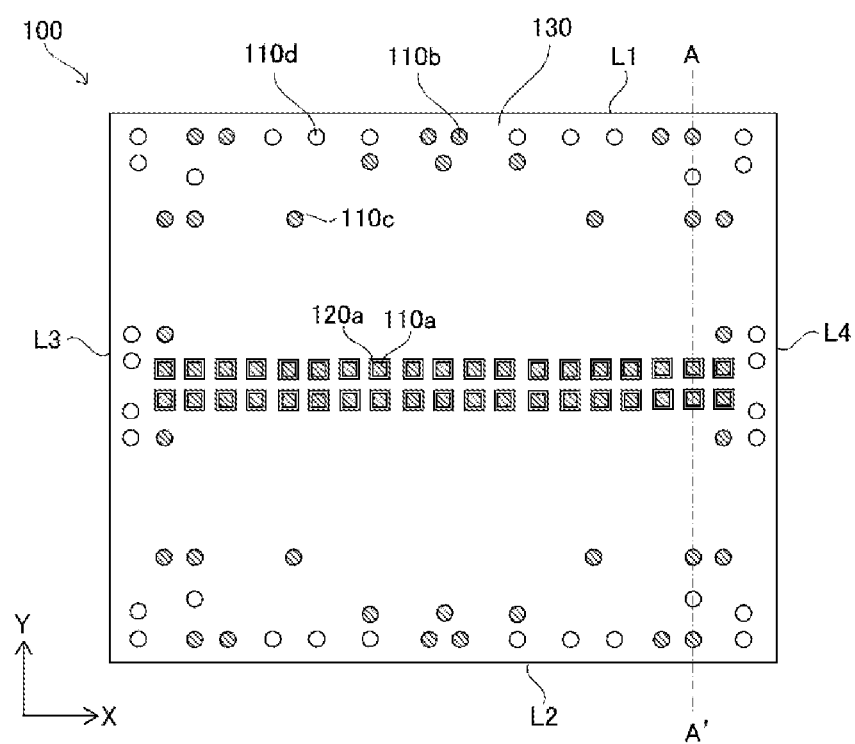
FIG. 2 is a schematic plan view for describing the layout of bump electrodes 110 provided in a semiconductor chip 100.
Figure 3:
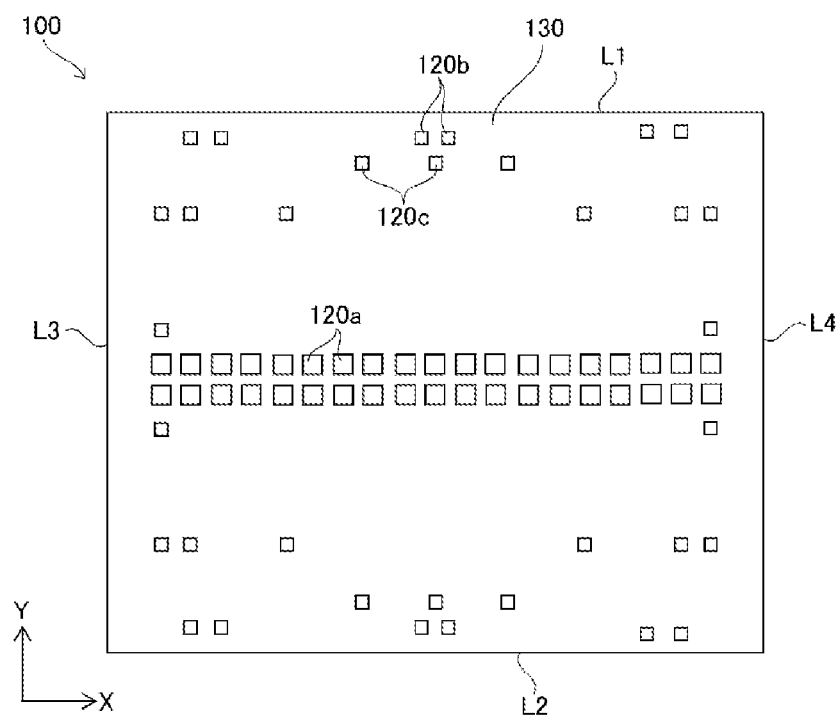
FIG. 3 is a schematic plan view showing pad electrodes 120.
Figure 4:
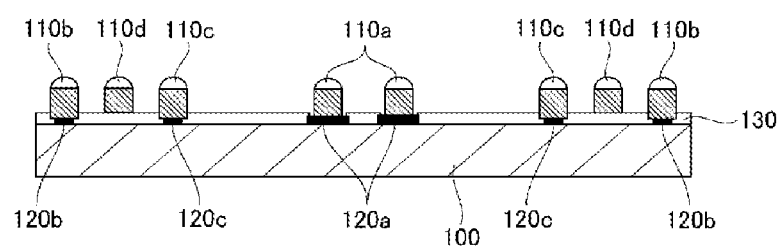
FIG. 4 is a schematic cross-sectional view along the line A-N shown in FIG. 2.

FIG. 2 is a schematic plan view for explaining the layout of the bump electrodes 110 provided on the semiconductor chip 100. Also FIG. 3 is a schematic plan view showing the pad electrodes 120 at the base of the bump electrodes 110. FIG. 4 is a schematic cross-sectional view along the line A-N in FIG. 2.

As shown in FIG. 2, the bump electrodes 110a are arranged in two rows in the X direction in substantially the center in the Y direction of the semiconductor chip 100. The bump electrodes 110a are used for input and output of signals and for supplying the external power supply voltage. As shown in FIGS. 2 to 4, the pad electrodes 120a corresponding to the bump electrodes 110a have a slightly larger plan size than the bump electrodes 110a.

On the other hand, the bump electrodes 110b to 110d are arranged in the vicinity of the outer peripheral region of the semiconductor chip 100. The bump electrodes 110b are used for supplying the external power supply voltage, and the bump electrodes 110c are used for connecting to bridge wiring that is described later. As shown in FIGS. 3 and 4, the pad electrodes 120b, 120c corresponding to the bump electrodes 110b, 110c have a slightly larger plan size than the corresponding bump electrodes 110b, 110c. Besides the function described above, the bump electrodes 110b, 110c perform the role of increasing the connection strength between the semiconductor chip 100 and the wiring substrate 200.

In other words, the semiconductor chip 100 made from silicon or the like and the wiring substrate 200 made from resin or the like have coefficients of thermal expansion that are greatly different from each other, so changes in temperature produce warping of the wiring substrate 200, and there is a possibility that the semiconductor chip 100 will peel away from the wiring substrate 200. In order to prevent this phenomenon, the bump electrodes 110b, 110c are arranged in the vicinity of the outer peripheral region of the semiconductor chip 100 where peeling can easily occur, to increase the connection strength between the two. Note that the dummy bump electrodes 110d are used solely for the purpose of increasing the connection strength. Therefore, as shown in FIGS. 3 and 4, pad electrodes corresponding to the dummy bump electrodes 110d are not necessary.

Figure 5:
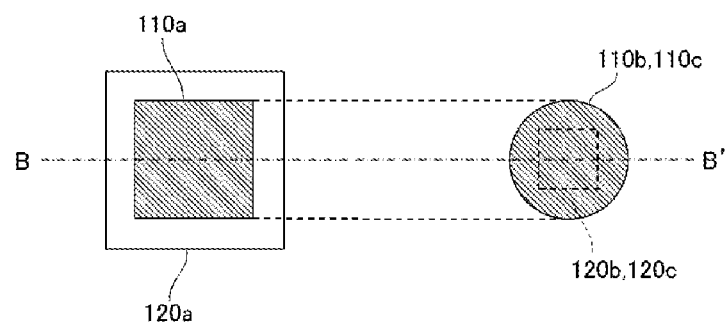
FIG. 5 is a schematic cross-sectional view for describing the shape of bump electrodes 110a to 110c.
Figure 6:
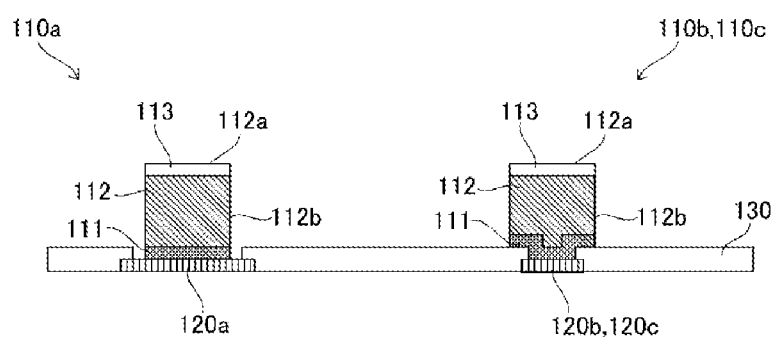
FIG. 6 is a schematic cross-sectional view along the line B-B' shown in FIG. 5.

FIG. 5 is a schematic cross-sectional view for explaining the shape of the bump electrodes 110a to 110c, and FIG. 6 is a schematic cross-sectional view along the line B-B' shown in FIG. 5.

As shown in FIG. 5, the plan shape of the bump electrodes 110a is square, and in contrast the plan shape of the bump electrodes 110b, 110c is circular. Although not shown on the drawings, the plan shape of the dummy bump electrodes 110d is also circular. Here, the length of one side of the bump electrode 110a is designed to be almost equal to the diameter of the bump electrodes 110b, 110c. Therefore, the cross-sectional area in a direction parallel to the main surface of the semiconductor chip 100 is greater in the bump electrodes 110a than the bump electrodes 110b, 110c. This means that the bump electrodes 110a with a square shape and that are arranged at a predetermined interval (pitch) can be arranged more densely and with lower resistance than the bump electrodes 110b, 110c.

Also, the plan shape of the pad electrodes 120a corresponding to the bump electrodes 110a is also square, and its size is larger than that of the bump electrodes 110a. Therefore, the outer peripheral portion of the pad electrodes 120a is not covered by the bump electrodes 110a. In contrast, the plan shape of the pad electrodes 120b, 120c corresponding to the bump electrodes 110b, 110c is square, but its size is smaller than that of the bump electrodes 110b, 110c. Therefore, the pad electrodes 120b, 120c are covered by the bump electrodes 110b, 110c on all surfaces. As a result of this configuration, the contact resistance between the bump electrodes 110a and the pad electrodes 120a is lower than the contact resistance between the bump electrodes 110b, 110c and the pad electrodes 120b, 120c, so it is possible to send and receive signals and provide the power supply via the pad electrodes 120a with low resistance.

One reason for designing the area of the pad electrodes 120a to be large is to enable contact by a tester probe carrying out tests in the wafer state. In contrast the pad electrodes 120b, 120c are not contacted by the probe during testing in the wafer state, so their area is designed to be smaller. Also, another reason is the pad electrodes 120b, 120c are arranged in the vicinity of the outer peripheral region of the semiconductor chip 100 where there is no pad area, as shown in FIG. 3, so it would be difficult to provide pads with large area in the wiring layer.

As stated above, the plan shape of the bump electrodes 110a is square, and in contrast the plan shape of the bump electrodes 110b to 110d is circular. The reason the plan shape of the bump electrodes 110a is square is because when a plurality of the bump electrodes 110a is arranged at a predetermined pitch, it is possible to maximize the cross-sectional area in a direction parallel to the main surface of the semiconductor chip 100. In this way it is possible to send and receive signals and provide the power supply via the bump electrodes 110a at low resistance. In contrast, the reason the plan shape of the bump electrodes 110b to 110d is circular is in order to increase the connection strength. In other words, if the plan shape of the bump electrodes 110b to 110d was square, when warping occurs on the wiring substrate 200, stresses are concentrated on the corner portions of the bump electrodes, so peeling can easily occur from this location. In contrast, if the plan shape of the bump electrodes 110b to 110d is circular, the stress is not concentrated in a particular location, so even if warping occurs in the wiring substrate 200 peeling does not easily occur. For these reasons the bump electrodes 110a to 110d are designed as described above. Note that the plan shape of the bump electrodes 110b to 110d is not limited to circular, but any shape in which stresses do not easily concentrate is desirable. For example, polygons such as a hexagonal shape or an octagonal shape in which the internal angles are each obtuse angles are desirable.

Next, the cross-sectional shape of the bump electrodes 110 is described. As shown in FIG. 6, the bump electrodes 110a to 110c include an under barrier metal (UBM) layer 111 that contacts the pad electrodes 120a to 120c, a pillar portion 112 that stands on the UBM layer 111, and a solder layer 113 provided on the top end surface 112a of the pillar portion 112. The UBM layer 111 is made from, for example, a stacked film of Ti and Cu, and the pillar portion 112 is made from Cu for example. The bump electrodes 110a to 110c shown in FIG. 6 are square prisms or circular prisms, therefore the angle formed between the top end surface 112a and the side surface 112b is substantially a right angle. Although not shown on the drawings, the dummy bump electrodes 110d do not have corresponding pad electrodes 120, but otherwise have the same structure as the bump electrodes 110a to 110c shown in FIG. 6.

Note that if the pillar portion 112 of the bump electrodes 110a, 110b, 110c, and 110d are produced by plating, they are formed simultaneously, so the position of the top end surface 112a of the pillar portion 112 of the insulating film bump electrode 110d is higher than the top end surface 112a of the pillar portion 112 of the bump electrodes 110a, 110b, 110c formed on the pad electrodes 120a, 120b, 120c. In this case, the pillar portion 112 of the bump electrode 110d is formed with a smaller diameter than the pillar portion 112 of the other bump electrodes 110a, 110b, 110c. By forming the diameter of the pillar portion 112 of the bump electrode 110d smaller, the area of the top end surface 112a of the pillar portion 112 is smaller than the area of the top end surface 112a of the pillar portion 112 of the other bump electrodes 110a, 110b, 110c, so the height after reflow of the solder bump formed thereupon is lower, and the height of the pillar portion 112 can be absorbed. In this way, the heights of the bump electrodes 110a, 110b, 110c, 110d including the solder layer 113 after reflow are substantially the same.

Figure 7:
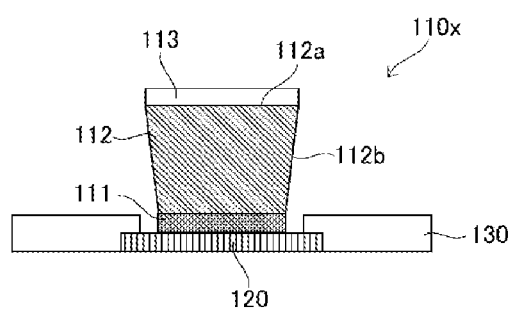
FIG. 7 is a schematic cross-sectional view showing the shape of the bump electrode 110X.
Figure 8:
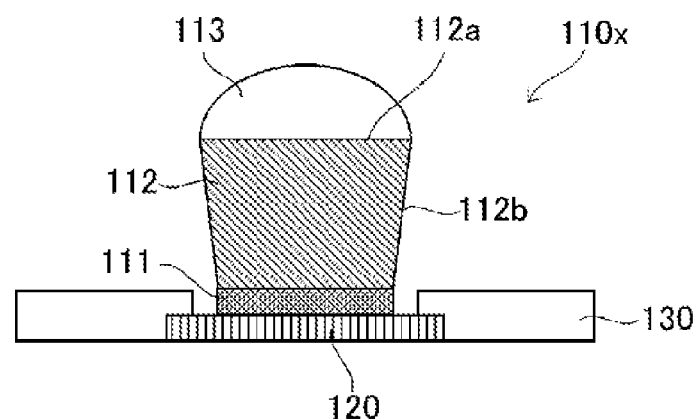
FIG. 8 is a schematic cross-sectional view for describing the melted state of the solder layer 113.

FIG. 7 is a schematic cross-sectional view showing the shape of an improved bump electrode 110X. The cross-section of the bump electrode 110X shown in FIG. 7 is an inverted trapezium, and therefore the angle formed between the top end surface 112a and the side surface 112b of the pillar portion 112 is an acute angle. If a bump electrode 110X having such a shape is used, it is difficult for the solder layer 113 that has melted due to reflow to wrap around the side surface 112b of the pillar portion 112 when flip chip connecting the semiconductor chip 100 to the wiring substrate 200. The melted solder layer 113 deforms into a hemispherical shape as shown in FIG. 8 due to surface tension, but if the solder layer 113 is thick, the melted solder layer 113 spills from the top end surface 112a of the pillar portion 112, and wraps around the side surface 112b. However, if the angle formed between the top end surface 112a and the side surface 112b is an acute angle, it is difficult for the solder layer 113 to wrap around in this way, so defective connections or short circuits due to spilling of the solder layer 113 can be prevented.

Figure 9:
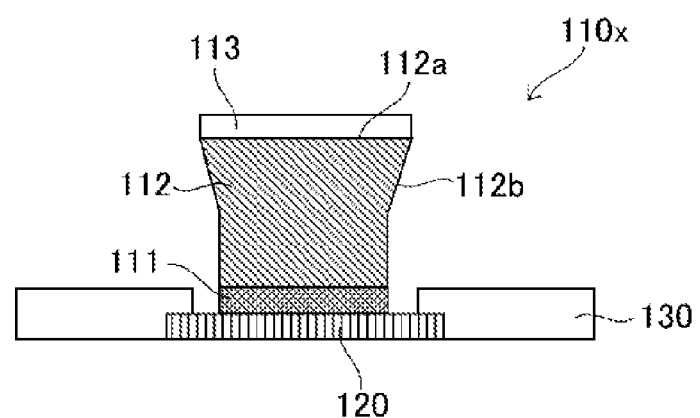
FIG. 9 is a schematic cross-sectional view showing the shape of a modified example of the bump electrode 110X.
Figure 10:
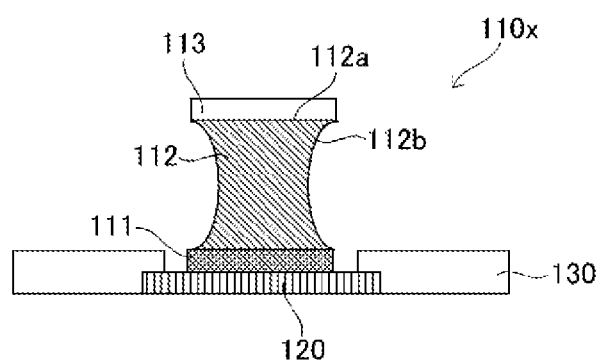
FIG. 10 is a schematic cross-sectional view showing the shape of a another modified example of the bump electrode 110X.

Note that in order to obtain this effect, it is not necessary that the side surface 112b be completely slanted, but the top portion only of the side surface 112b where it contacts the top end surface 112a may be slanted, and the remainder may be vertical, as shown in FIG. 9. Alternatively, the upper portion of the side surface 112b that contacts the top end surface 112a may be formed slanting so that the diameter increases in the upward direction, and the lower portion of the side surface 112b that contacts the UBM layer 111 may be formed slanting so that the diameter increases in the downward direction so that the side surface 112b has a spindle shape. In other words, it is sufficient if the angle formed between the top end surface 112a of the pillar portion 112 and the portion of the side surface 112b in contact with the top end surface 112a is an acute angle.

Figure 11:
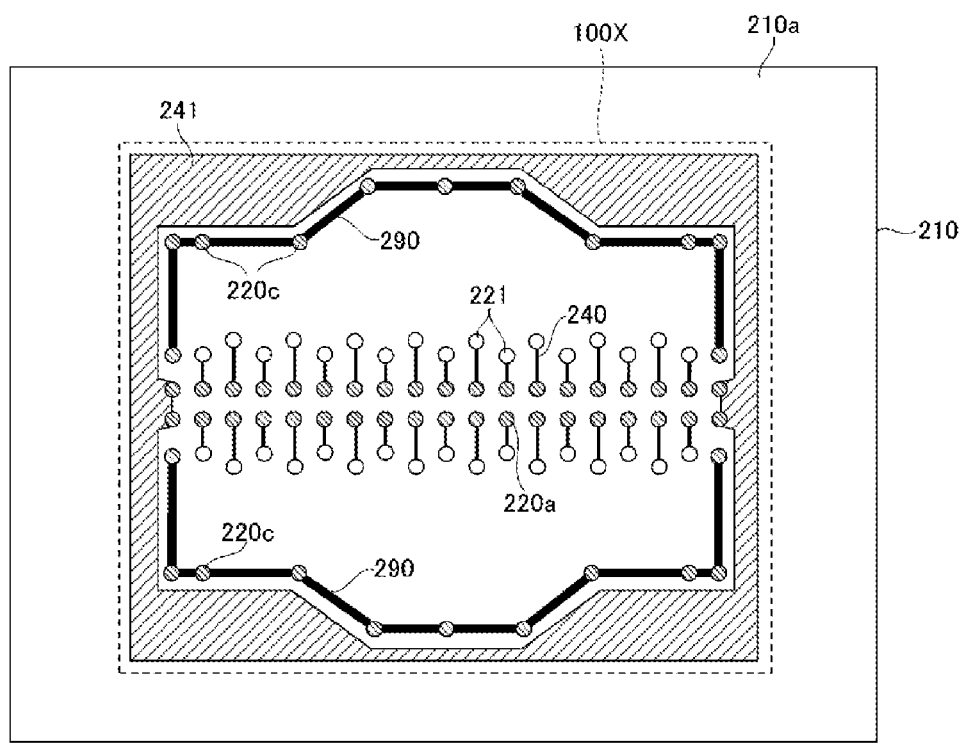
FIG. 11 is a schematic cross-sectional view for describing the conductor pattern formed on a first surface 210a of the insulating substrate 210.

FIG. 11 is a schematic plan view for explaining the conductor pattern formed on the first surface 210a of the insulating substrate 210. The broken line 100X shown in FIG. 11 is the area where the semiconductor chip 100 is mounted.

As shown in FIG. 11, a plurality of connecting electrodes 220, a plurality of wiring patterns 240, and two bridge wirings 290 are provided on the first surface 210a of the insulating substrate 210. Describing more specifically, of the connecting electrodes 220, the connecting electrodes 220a connected to the bump electrodes 110a are connected to through hole conductors 221 via the wiring pattern 240. The through hole conductors 221 are conductors provided passing through the insulating substrate 210, and are connected to a land pattern 230 and external terminals 260 provided on the second surface 210b of the insulating substrate 210.

Figure 12:
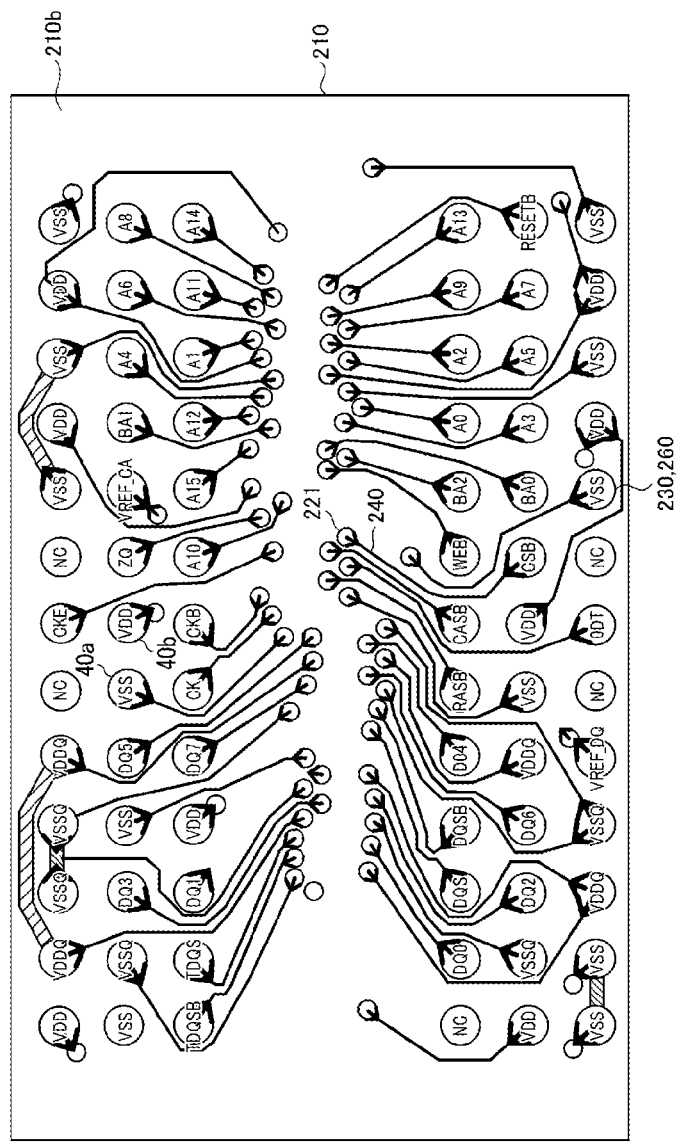
FIG. 12 shows an example of the layout of external terminals 260 provided on a second surface 210b of the insulating substrate 210.

FIG. 12 shows an example of the layout of the external terminals 260 provided on the second surface 210b of the insulating substrate 210. As shown in FIG. 12, a wiring pattern 240 that connects the through hole conductors 221 and the land pattern 230 (external terminals 260) is provided on the second surface 210b of the insulating substrate 210.

Returning to FIG. 11, of the connecting electrodes 220, the connecting electrodes 220c connected to the bump electrodes 110c are connected together via the bridge wiring 290. The bridge wiring 290 is not connected to the other wiring pattern 240, and therefore is not connected to any of the external terminals 260. The plurality of bump electrodes 110c are electrically short-circuited together by the bridge wiring 290.

Note that the bump electrodes 110b and the dummy bump electrodes 110d are directly connected to a large area power supply pattern 241 provided on the first surface 210a of the insulating substrate 210.

Figure 13:
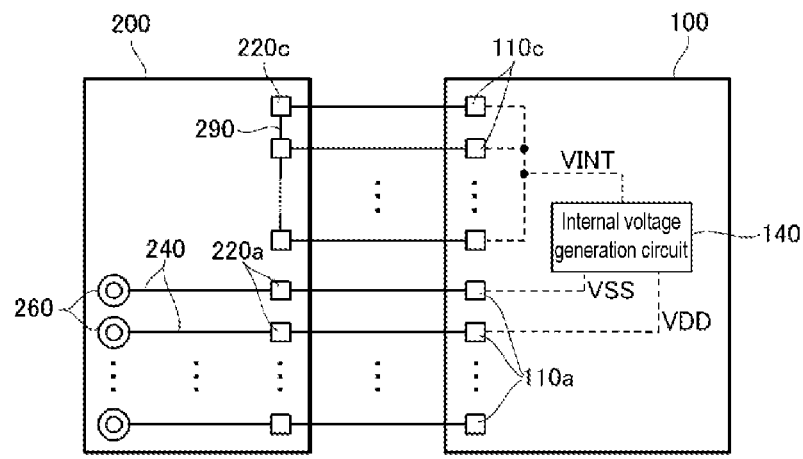
FIG. 13 is a schematic view for describing an example of the connection relationship between the semiconductor chip 100 and the wiring substrate 200.

FIG. 13 is a schematic view for explaining the connection relationship between the semiconductor chip 100 and the wiring substrate 200.

As shown in FIG. 13, the semiconductor chip 100 includes an internal voltage generation circuit 140 that generates an internal power supply voltage VINT. The internal voltage generation circuit 140 receives external power supply voltages VDD, VSS supplied via the external terminals 260, and generates the internal power supply voltage VINT based on these. The internal power supply voltage VINT is a voltage generated within the semiconductor chip 100 and is not supplied from the outside, so the capacity of the internal voltage generation circuit 140 is designed based on the load of the circuits using the internal power supply voltage VINT. However in cases where the circuits using the internal power supply voltage VINT are arranged dispersed within the semiconductor chip 100, or very many circuits use the internal power supply voltage VINT, depending on the plan position within the semiconductor chip 100 the voltage reduction of the internal power supply voltage VINT might be large. This voltage reduction is designed to be reduced as much as possible by configuring the power supply wiring network within the semiconductor chip 100 in a mesh form, but in advanced semiconductor chips 100 with high speed and high function it may not be possible to sufficiently reduce this voltage reduction.

In the present embodiment, the wiring that supplies this internal power supply voltage VINT is bypassed by the bridge wiring 290. In other words, by using not only the power supply wiring network within the semiconductor chip 100, but additionally using the bridge wiring 290 provided in the wiring substrate 200, the impedance of the wiring that supplies the internal power supply voltage VINT is reduced. Moreover, the bridge wiring 290 is wiring provided on the wiring substrate 200 side, so its film thickness is extremely small compared with the wiring provided within the semiconductor chip 100. Therefore, the bridge wiring 290 has extremely low resistance, and by bypassing the wiring that supplies the internal power supply voltage VINT using the bridge wiring 290, the voltage reduction of the internal power supply voltage VINT can be greatly reduced.

Figure 14:
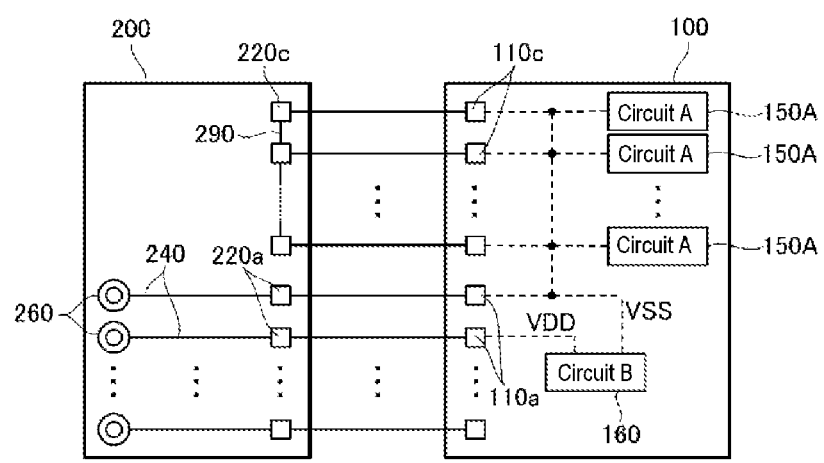
FIG. 14 is a schematic view for describing another example of the connection relationship between the semiconductor chip 100 and the wiring substrate 200.

However, the wiring that is bypassed using the bridge wiring 290 in the present invention is not limited to wiring that supplies the internal power supply voltage VINT. For example, as shown in FIG. 14, the wiring that supplies the external power supply voltage VSS within the semiconductor chip 100 may be connected to the bump electrodes 110c, and in this way the wiring can be bypassed using the bridge wiring 290. For example if there are circuits 150A that are easily affected by power supply noise arranged in a dispersed manner, and there is a circuit 150B that is a source of generation of power supply noise, if the power supply wiring in the vicinity of each of the circuits 150A is connected to the bump electrodes 110c, and in this way the power supply wiring is bypassed between the plurality of circuits 150A, the effect of the noise can be reduced.

Next, a process for manufacturing the bump electrodes 110 is described.

FIGS. 15A to 15D and FIGS. 16A to 16C are process diagrams for describing a process of manufacturing the bump electrodes 110a, 110c.

Figure 15:
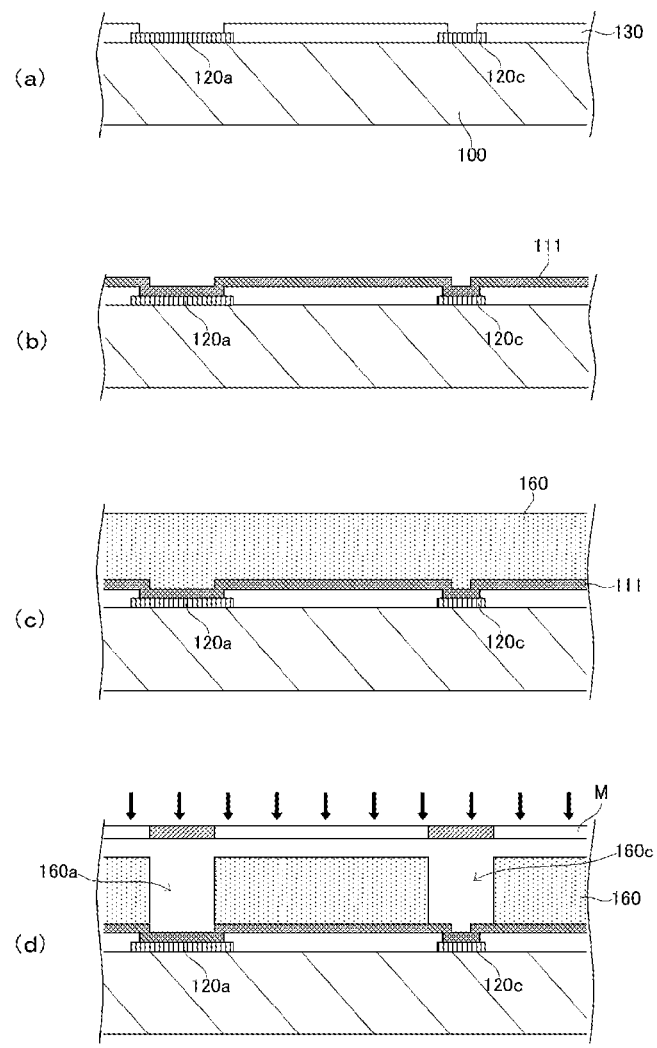
FIG. 15 is a process diagram for describing the process of manufacturing the bump electrode 110.

First, as shown in FIG. 15A, the pad electrodes 120a, 120c are formed by patterning the wiring layer of the uppermost layer included in the semiconductor chip 100. Preferably aluminum is used as the material of the pad electrodes 120a, 120c. Then, these are covered with a protective film 130 configured from a passivation film or a polyimide film, so that a portion of the pad electrodes 120a, 120c is exposed. The reason that the sizes of the pad electrode 120a and the pad electrode 120c are different is because of the difference in the necessity for contact by the tester probe, as described previously. The test using the probe is carried out in the state as shown in FIG. 15A.

Next, as shown in FIG. 15B, the UBM film 111 is formed over the whole surface. Forming the UBM film 111 can be carried out by sputtering Ti and Cu in this order. Next as shown in FIG. 15C, a resist film 160 is formed on the surface of the UBM film 111. There is no particular limitation on the thickness of the resist film 160, but it can be for example about 20 μm.

Next, as shown in FIG. 15D, a mask M in which openings having a predetermined pattern are formed is disposed on the semiconductor chip 100, and by carrying out exposure to light and developing, openings 160a, 160c are formed in the resist film 160. Here a positive resist is shown on the drawings, but a negative resist may also be used. The openings 160a, 160c are provided at the positions where the bump electrodes 110a, 110c are to be formed. In the example shown in FIG. 15D, the internal walls of the openings 160a, 160c are substantially vertical, but the internal walls of the openings 160a, 160c can be slanted by adjusting the focus position during light exposure or the like.

Figure 16:
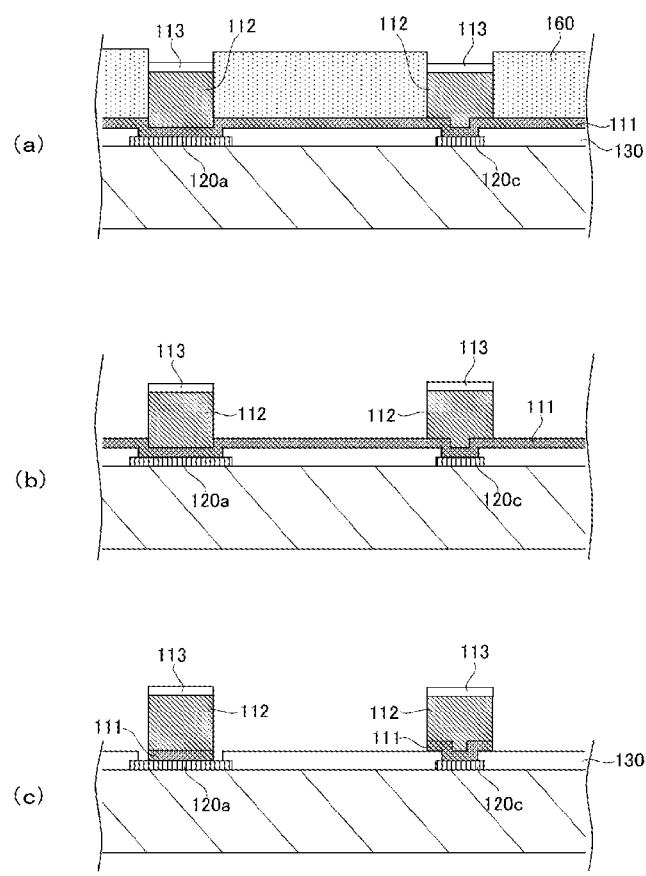
FIG. 16 is a process diagram for describing the process of manufacturing the bump electrode 110.

Next, as shown in FIG. 16A, the pillar portions 112 and the solder layer 113 are formed on the UBM layer 111 exposed by the openings 160a, 160c by electroplating. Then, after the resist film 160 is removed as shown in FIG. 16B, the portion of the UBM film 111 that is not covered with the pillar portions 112 is removed, and the bump electrodes 110a, 110c are completed. Note that if the internal walls of the openings 160a, 160c are slanted by adjusting the focus position or the like, the cross-sectional shape of the bump electrodes 110a, 110c will reflect this shape, and bump electrodes 110X as shown in FIGS. 7 to 10 can be manufactured.

Note that in the description above the bump electrodes 110a, 110c were formed simultaneously, but the other bump electrodes 110b, 110d can also be formed at the same time. As described previously, there are no pad electrodes 120 corresponding to the dummy bump electrodes 110d, so they are formed on the protective film 130. After these bump electrodes 110a to 110d have been formed, reflow of the semiconductor chip 100 is carried out at a predetermined temperature, for example about 240° C. and the solder layer 113 is melted, and the solder layer 113 takes a hemispherical shape due to surface tension.

Note that the process as described above may be carried out on each individual semiconductor chip 100, but normally it will be carried out in one operation on a plurality of semiconductor chips 100 in the wafer state. Also, after the process as described above has been completed, the individual semiconductor chips 100 are obtained by dicing the wafer. The individual semiconductor chips 100 are flip chip mounted on the wiring substrate 200 as described next.

FIGS. 17A to 17E are process diagrams for describing the process of flip chip mounting the semiconductor chip 100 onto the wiring substrate 200.

Figure 17:
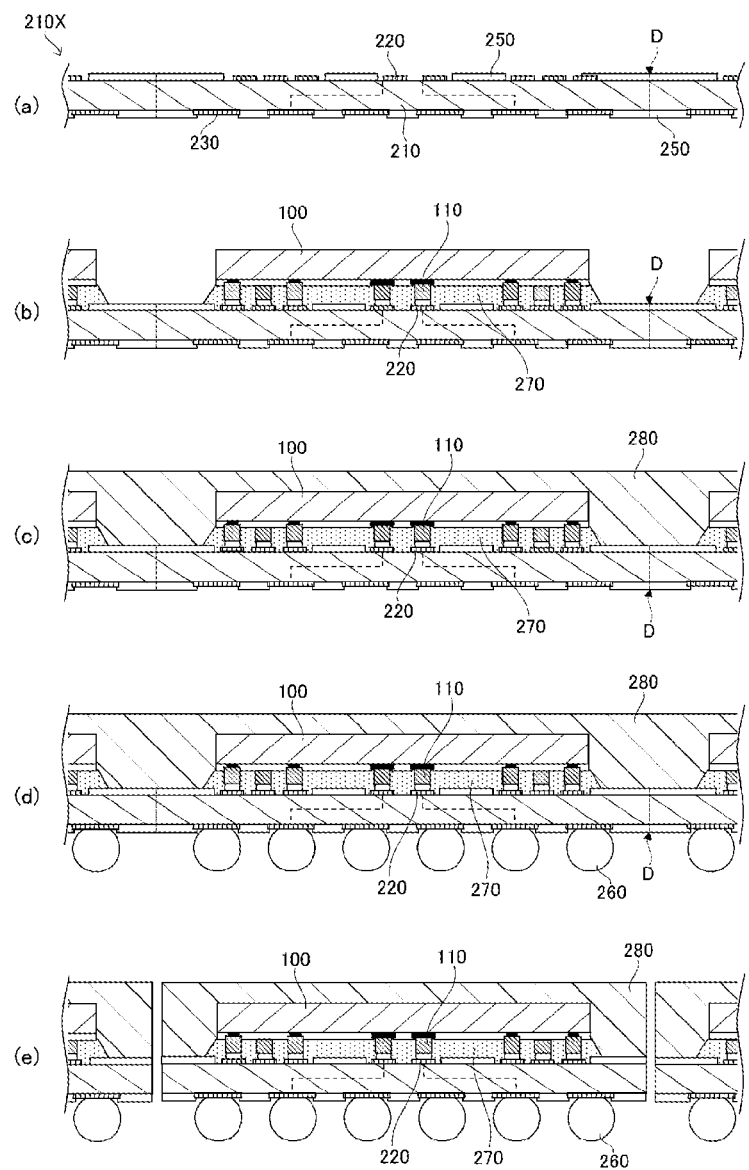
FIG. 17 is a process diagram for describing the process of flip chip mounting the semiconductor chip 100 on the wiring substrate 200.

First, as shown in FIG. 17A, a large area insulating substrate 210X capable of mounting a plurality of semiconductor chips 100 is prepared, and the connecting electrodes 220, the land pattern 230, the solder resist 250, and so on are formed on both sides thereof. Note that the broken line D shown in FIG. 17A is the dicing line where cutting is carried out in the next process. Next, as shown in FIG. 17B, the semiconductor chips 100 are connected by flip chip bonding to the mounting regions defined on the surface of the insulating substrate 210.

The flip chip bonding is carried out in a positioned state so that the bump electrodes 110 provided on the semiconductor chip 100 and the connecting electrodes 220 provided on the insulating substrate 210 are joined. Specifically, the reverse surface of the semiconductor chip 100 is held by suction using a bonding tool that is not shown on the drawings, and the bump electrodes 110 and the connecting electrodes 220 are joined at a temperature of about 240° C. while a load is applied. Then, the gap between the wiring substrate 200 and the semiconductor chip 100 is filled with underfill 270. By supplying the underfill 270 to a position in the vicinity of the edges of the semiconductor chip 100 using for example a dispenser or the like that is not shown on the drawings, the supplied underfill material fills the gap between the wiring substrate 200 and the semiconductor chip 100 by capillary action.

After filling with underfill 270, curing is carried out at a predetermined temperature of, for example, about 150° C., the underfill 270 hardens, and a fillet is formed as shown in FIG. 17B. Note that instead of underfill 270, non conductive paste (NCP) may be used.

Next, as shown in FIG. 17C, the whole surface of the wiring substrate 200 is covered with sealing resin 280 so that the semiconductor chip 100 is embedded, then as shown in FIG. 17D the external terminals 260 made from solder balls are mounted on the land pattern 230. Then as shown in FIG. 17E, the wiring substrate 200 is cut along the dicing line D, and a plurality of the semiconductor devices 10 can be obtained.

Note that in the above description it was explained that the gap between the wiring substrate 200 and the semiconductor chip 100 was filled in advance with underfill 270, but by using a technology such as mold underfill (MUF) or the like, the technology may be used to fill the gap when molding.

As described above, the semiconductor device 10 according to the present embodiment is provided with bridge wiring 290 in the wiring substrate 200, so the plurality of pad electrodes 120c provided in the semiconductor chip 100 is bypassed by the bridge wiring 290. As a result, the impedance of the wiring connected to the pad electrodes 120c, for example the wiring that supplies the internal power supply voltage, can be greatly reduced.

Next, a second embodiment of the present invention is described.

Figure 18:
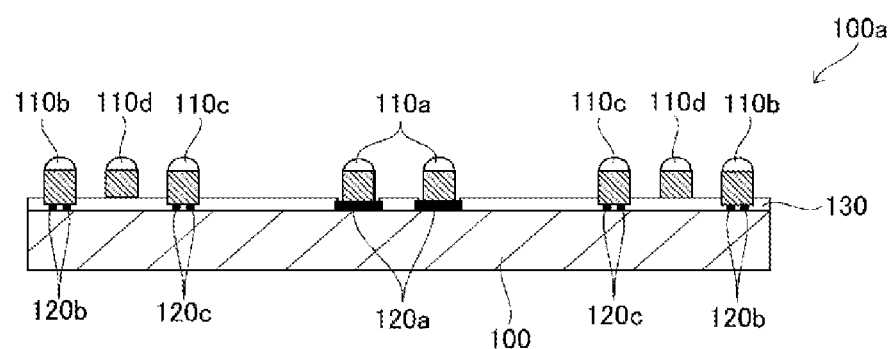
FIG. 18 is a schematic cross-sectional view for describing the structure of the semiconductor chip 100a used in a second embodiment.

FIG. 18 is a schematic cross-sectional view for explaining the structure of a semiconductor chip 100a used in the second embodiment.

As shown in FIG. 18, in the semiconductor chip 100a used in the present embodiment, two very small pad electrodes 120b, 120c are provided at the base of the bump electrodes 110b, 110c respectively. In all other respects the semiconductor chip 100 is the same as the semiconductor chip 100 used in the first embodiment, so the same elements are given the same reference symbols, and duplicated descriptions are omitted. Also, the wiring substrate 200 used in the present embodiment is the same as that of the first embodiment.

Figure 19:
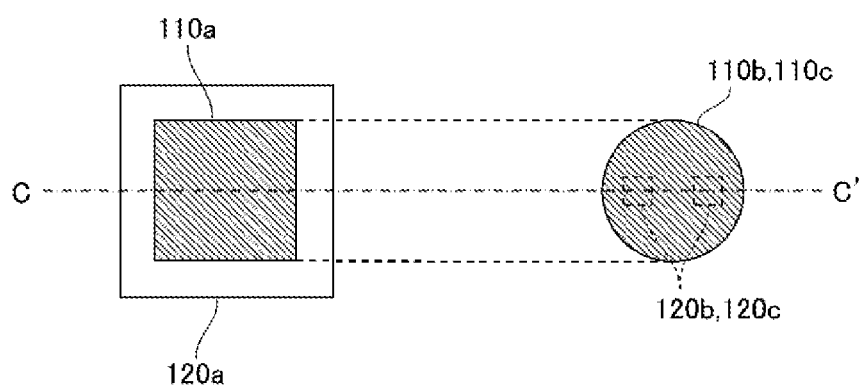
FIG. 19 is a schematic plan view for describing the shape of the bump electrodes 110a to 110c.
Figure 20:
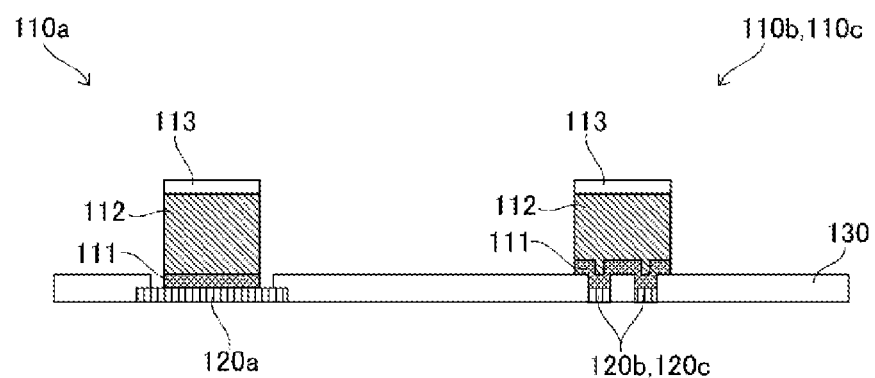
FIG. 20 is a schematic cross-sectional view along the line C-C' shown in FIG. 19.

FIG. 19 is a schematic plan view for describing the shape of the bump electrodes 110a to 110c, and FIG. 20 is a schematic cross-sectional view along the line C-C' shown in FIG. 19.

As shown in FIGS. 19 and 20, the plan shapes of the bump electrodes 110a, 110b, 110c are the same as in the first embodiment. However, there is one pad electrode 120a corresponding to each bump electrode 110a, and in contrast there are two pad electrodes 120b, 120c corresponding to the bump electrodes 110b, 110c. These two pad electrodes 120b, 120c are covered by the corresponding bump electrodes 110b, 110c.

Figure 21:
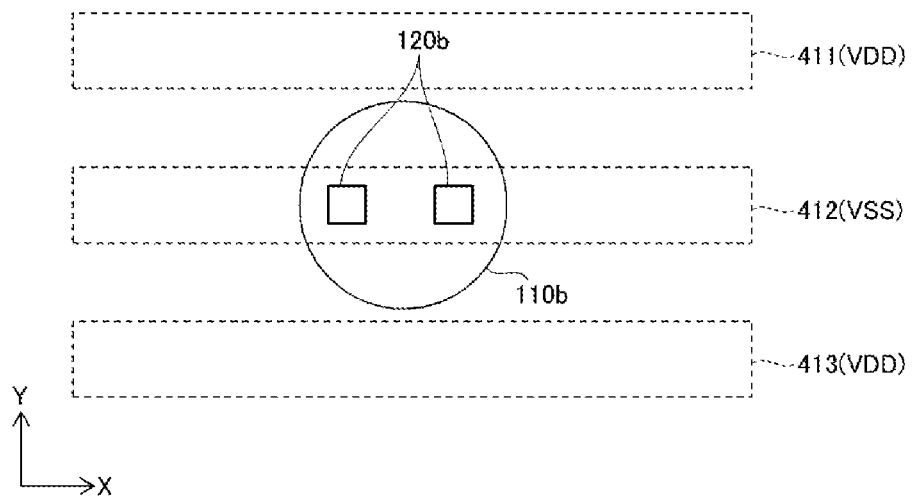
FIG. 21 is a schematic plan view for describing a first example of the relationship between the pad electrodes 120b and the wiring layer of the uppermost layer.

FIG. 21 is a schematic plan view for describing a first example of the relationship between the pad electrodes 120b and the wiring layer of the uppermost layer.

In the example shown in FIG. 21, power supply wiring 411 to 413 is provided extending in the X direction on the wiring layer of the uppermost layer. Of these, the power supply wiring 411, 413 is wiring to which the power supply voltage VDD is applied, and the power supply wiring 412 is wiring to which the ground voltage VSS is applied. The wiring to which the power supply voltage VDD is applied and the wiring to which the ground voltage VSS is applied are frequently arranged alternately in this way.

Also in the example shown in FIG. 21, a portion of the power supply wiring 412 is used as pad electrodes 120b at two locations. These two pad electrodes 120b are arranged in the X direction along the power supply wiring 412. The width of the power supply wiring 412 is not particularly widened at the locations corresponding to the pad electrodes 120b, and therefore the pad electrodes 120b do not encroach on the other power supply wiring 411, 413. Moreover, two pad electrodes 120b are allocated for one bump electrode 110b, so even though the plan size of the pad electrodes 120b is very small, the contact resistance can be reduced.

Figure 22:
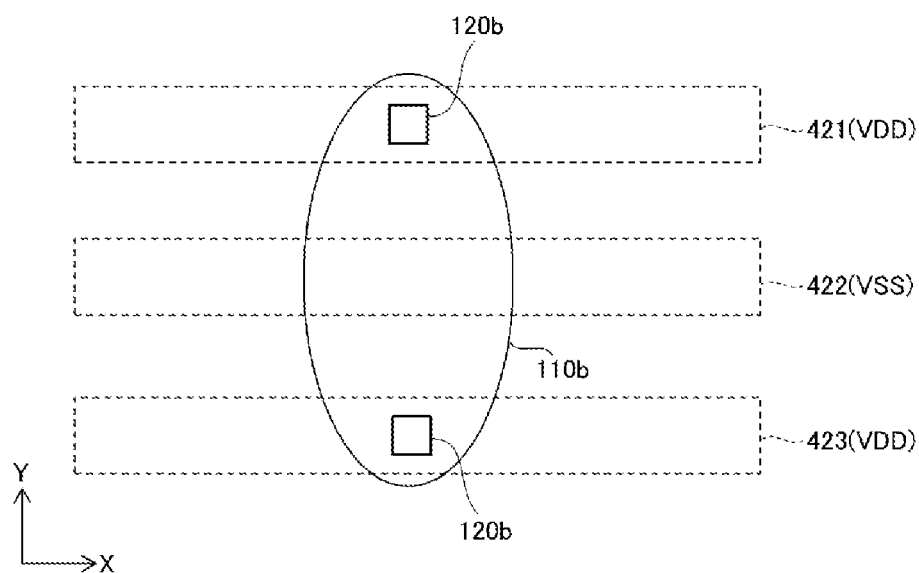
FIG. 22 is a schematic plan view for describing a second example of the relationship between the pad electrodes 120b and the wiring layer of the uppermost layer.

FIG. 22 is a schematic plan view for describing a second example of the relationship between the pad electrodes 120b and the wiring layer of the uppermost layer.

In the example shown in FIG. 22, power supply wiring 421 to 423 is provided extending in the X direction in the wiring layer of the uppermost layer. Of these, power supply wiring 421, 423 is wiring to which the power supply voltage VDD is applied, and power supply wiring 422 is wiring to which the ground voltage VSS is applied. In this example also, the wiring to which the power supply voltage VDD is applied and the wiring to which the ground voltage VS S is applied are arranged alternately.

In the example shown in FIG. 22, a portion of the power supply wiring 421 and a portion of the power supply wiring 423 are used as pad electrodes 120b. These two pad electrodes 120b are arranged in the Y direction straddling the power supply wiring 422. The width of the power supply wiring 421, 423 is not particularly widened at the positions corresponding to the pad electrodes 120b, and therefore the pad electrodes 120b do not encroach on the power supply wiring 422. In this example, one bump electrode 110b can be allocated to two different power supply wiring 421, 423. Although here the two different power supply wiring 421, 423 is wiring to which the same voltage is applied, they are wiring formed separated from each other on the wiring layer of the uppermost layer. Therefore, these are short-circuited in another wiring layer located in a lower layer.

In this way, according to the present embodiment, two pad electrodes 120b are allocated to one bump electrode 110b, so even though the plan size of the pad electrodes 120b is very small the contact resistance can be reduced. Also, as in the example shown in FIG. 22, a single bump electrode 110b can be allocated to two different wirings.

Note that in FIGS. 21 and 22, the relationship between the bump electrodes 110b and the pad electrodes 120b was described, but the relationship between the bump electrodes 110c and the pad electrodes 120c is similar.

In this way, in the present embodiment the same effect as that of the first embodiment described above can be obtained, and also two pad electrodes 120b, 120c can be allocated to one bump electrode 110b, 110c, so even though the plan size of the pad electrodes 120b, 120c is very small, the contact resistance can be reduced.

Note that in the present embodiment, two pad electrodes 120b, 120c are allocated to the bump electrodes 110b, 110c, but three or more pad electrodes 120b, 120c may be allocated. Also, it is not essential that a plurality of pad electrodes 120b, 120c is allocated to all the bump electrodes 110b, 110c, and a plurality of pad electrodes 120b, 120c may be allocated to only some of the bump electrodes 110b, 110c.

Next, a third embodiment of the present invention is described.

Figure 23:
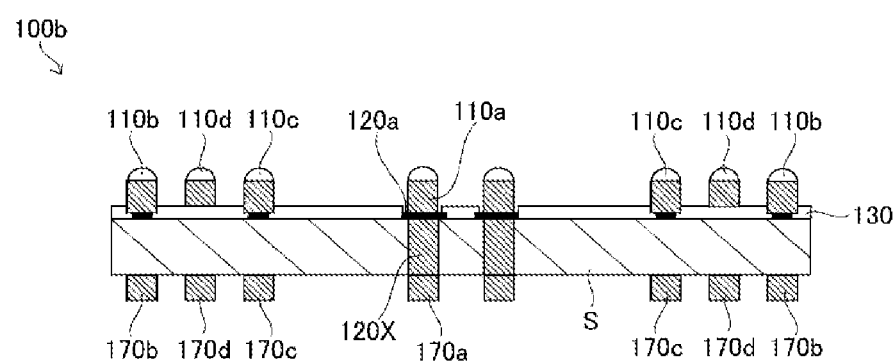
FIG. 23 is a schematic cross-sectional view for describing the structure of the semiconductor chip 100b used in a third embodiment.

FIG. 23 is a schematic cross-sectional view for describing the structure of a semiconductor chip 100b according to the third embodiment. Also FIG. 24 is a schematic cross-sectional view for describing the structure of a semiconductor device 20 in which a plurality of the semiconductor chips 100b is stacked on the wiring substrate 200.

As shown in FIG. 23, the semiconductor chip 100b used in the present embodiment differs from the semiconductor chip 100 used in the first embodiment in that a penetrating electrode 120X is provided corresponding to pad electrodes 120a. The penetrating electrode 120X is provided penetrating a semiconductor substrate S made from silicon or the like, and is electrically connected to a reverse surface bump 170a provided on a reverse surface of the semiconductor substrate S. Penetrating electrodes 120X are not provided corresponding to the other pad electrodes 120b, 120c, but dummy reverse surface bumps 170b to 170d are provided on the reverse surface of the semiconductor substrate S in positions that overlap with the bump electrodes 110b to 110d in plan view.

Figure 24:
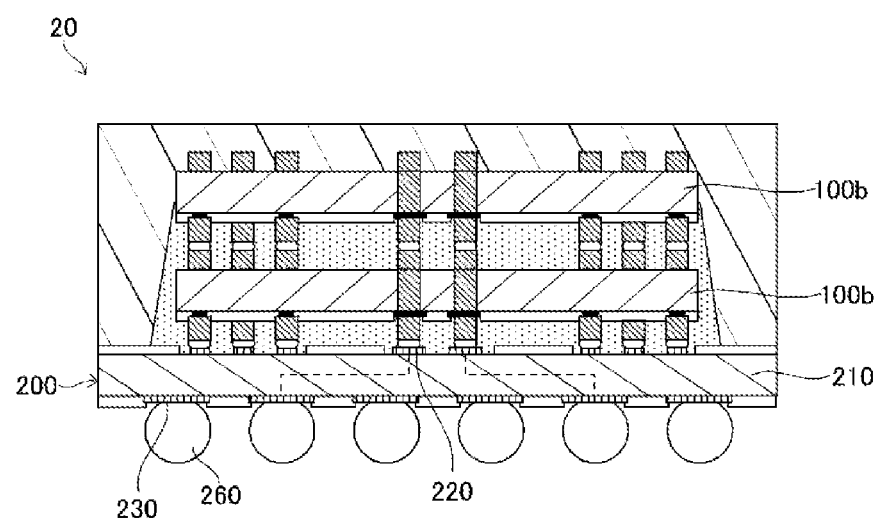
FIG. 24 is a schematic cross-sectional view for describing the structure of a semiconductor device 20.

A plurality of the semiconductor chips 100b having this structure can be mounted stacked on the wiring substrate 200 as shown in FIG. 24. In the example shown in FIG. 24, an example is shown in which two semiconductor chips 100b are stacked, but three or more semiconductor chips 100b can be stacked. As shown in FIG. 24, the reverse surface bumps 170a to 170d of the semiconductor chip 100b located on the bottom layer are connected to the bump electrodes 110a to 110d located on the top layer.

Figure 25:
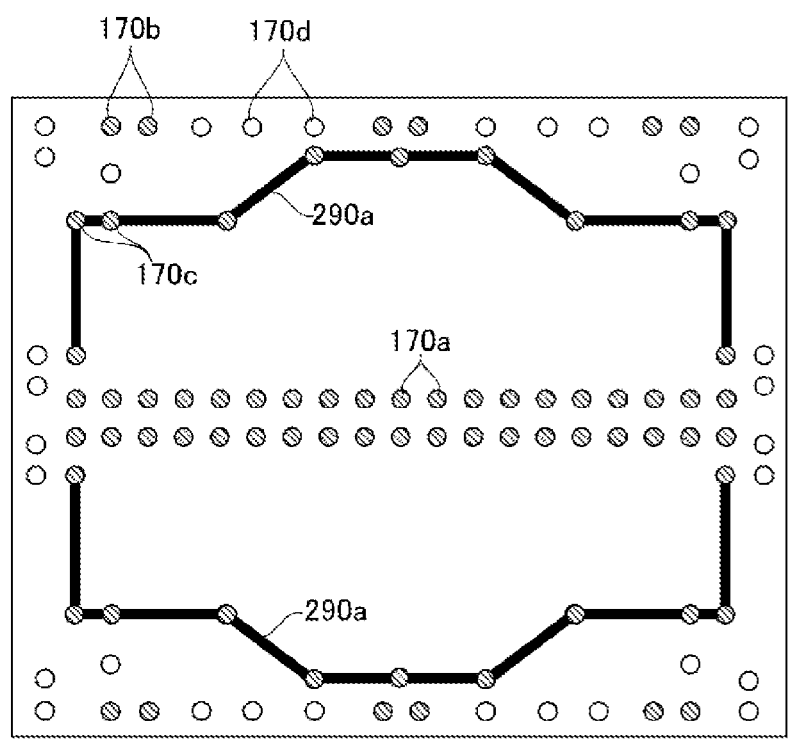

As a result of this configuration, for the semiconductor chip 100b on the bottommost layer for example the impedance of the wiring supplying the internal power supply voltage VINT can be reduced by the bridge wiring 290, the same as for the first embodiment as described above. On the other hand, for the semiconductor chip 100b on the upper layer, the above effect cannot be obtained because it is not directly mounted on the wiring substrate 200, but if the reverse surface bumps 170c of each semiconductor chip 100b are short-circuited by the bridge wiring 290a as shown in FIG. 25, the same effect as for the first embodiment can also be obtained for the semiconductor chip 100b of the upper layer. The bridge wiring 290a formed on the reverse surface of the semiconductor chip 100b may be formed at the same time in the process of forming the reverse surface bumps 170a to 170d. Note that in the present embodiment, the plan shape of the bump electrodes 110a and the reverse surface bumps 170a is circular. This is because the plan shape of the penetrating electrode 120X is circular.

Next, a fourth embodiment of the present invention is described.

Figure 26:
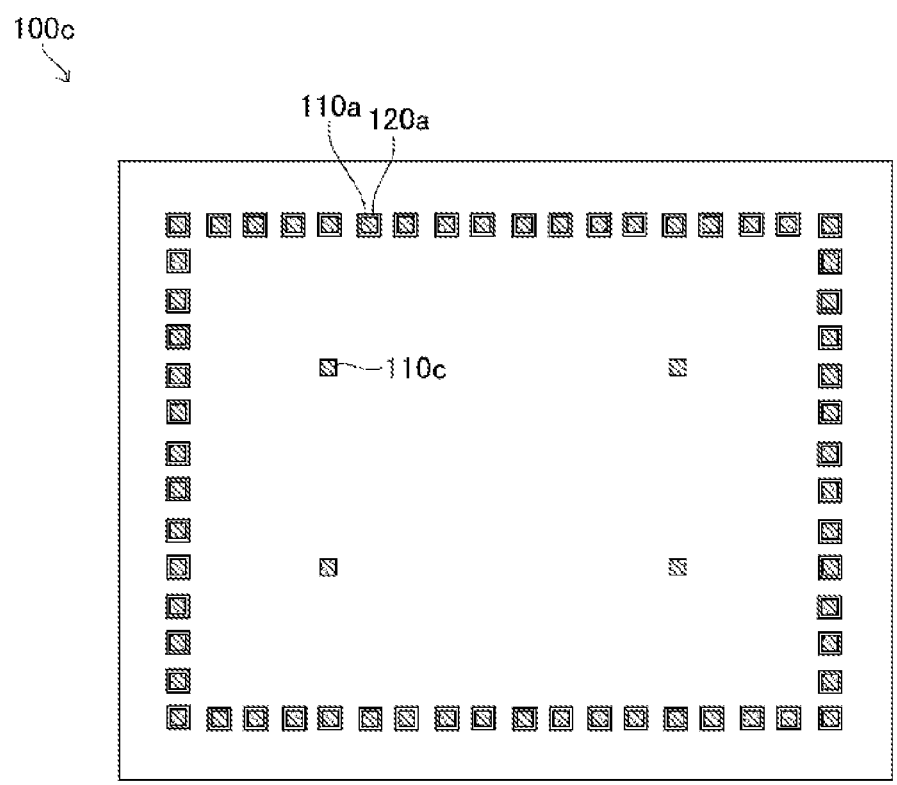
FIG. 26 is a schematic plan view showing the layout of the main surface of the semiconductor chip 100c used in a fourth embodiment.
Figure 27:
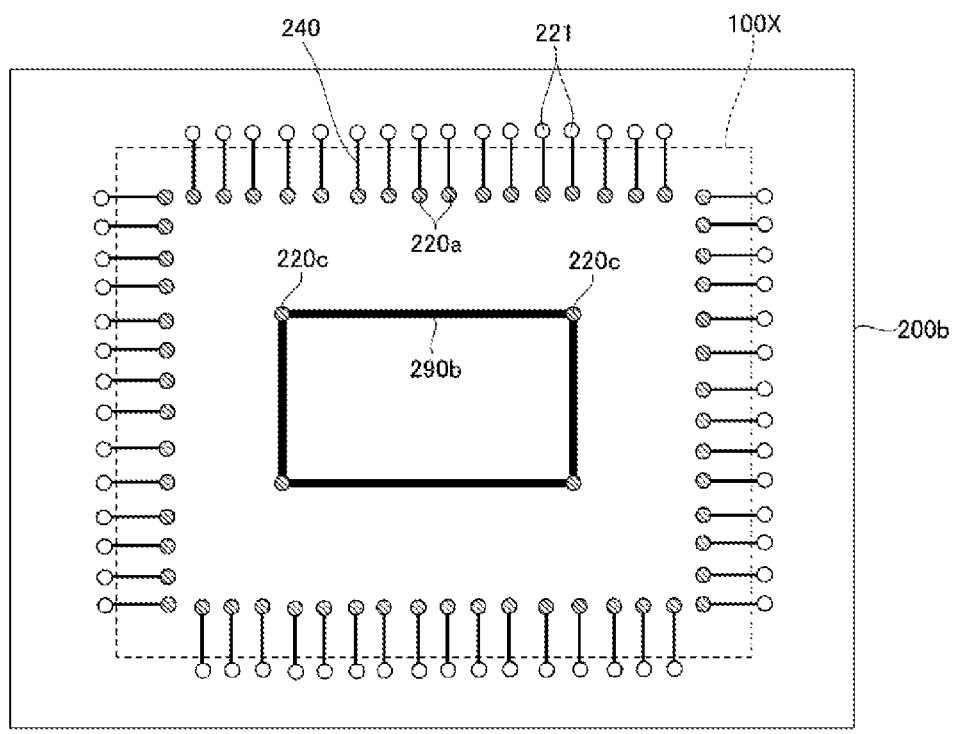
FIG. 27 is a schematic plan view for describing the conductor pattern formed on the wiring substrate 200b.

FIG. 26 is a schematic plan view showing the layout of the main surface of a semiconductor chip 100c used in the fourth embodiment. Also, FIG. 27 is a schematic plan view for explaining the conductor pattern formed on a wiring substrate 200b used in the fourth embodiment. The broken line 100X shown in FIG. 27 is the area for mounting the semiconductor chip 100c.

As shown in FIG. 26, the semiconductor chip 100c used in the present embodiment has bump electrodes 110a arranged along the outer periphery thereof. Also, the plurality of the bump electrodes 110c is arranged so as to surround the bump electrodes 110a. In the present embodiment, the bump electrodes 110a are arranged along the outer periphery of the semiconductor chip 100c, so peeling of the semiconductor chip 100c due to temperature changes does not easily occur. Therefore, the dummy bump electrodes 110d are not provided, unlike in the first embodiment, but dummy bump electrodes 110d may be provided.

Connecting electrodes 220a, 220c are provided on the wiring substrate 200b in positions corresponding to the bump electrodes 110a, 110c as shown in FIG. 27. Also, the connecting electrodes 220c connected to the bump electrodes 110c are connected via bridge wiring 290b in a shared fashion. The bridge wiring 290b is not connected to the other wiring pattern 240, the same as for the first embodiment, and therefore is not connected to any of the external terminals 260. As a result in the present embodiment the same effect can be obtained as for the first embodiment as described above.

In this way, in the present invention, there is no particular limitation on the layout of the bump electrodes 110 on the semiconductor chip.

Next, a fifth embodiment of the present invention is described.

Figure 28:
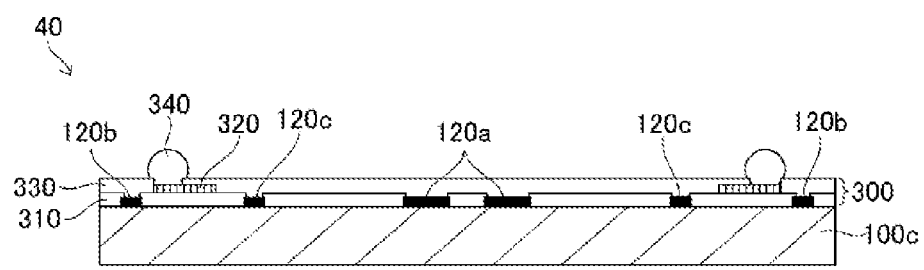
FIG. 28 is a schematic cross-sectional view for describing the structure of a semiconductor device 40 according to a fifth embodiment of the present invention.

FIG. 28 is a schematic cross-sectional view for describing the structure of a semiconductor device 40 according to the fifth embodiment of the present invention.

As shown in FIG. 28, the semiconductor device 40 according to the present embodiment is configured from a semiconductor chip 100d and a wiring structure 300 formed on a main surface thereof. The semiconductor device 40 according to the present embodiment has a structure referred to as a wafer level package (WLP), and does not use a rigid insulating substrate as in the first to fourth embodiments.

The wiring structure 300 includes a first insulating film 310 that covers the main surface of the semiconductor chip 100d, a wiring layer 320 formed on the surface of the first insulating film 310, a second insulating film 330 that covers the wiring layer 320, and external terminals 340 formed on the surface of the second insulating film 330. A plurality of through holes that expose the pad electrodes 120 is provided in the first insulating film 310, and the pad electrodes 120 and the wiring layer 320 are electrically connected via these through holes. Likewise, a plurality of through holes that expose the wiring layer 320 is provided in the second insulating film 330, and the wiring layer 320 and the external terminals 340 are electrically connected via the through holes. The wiring layer 320 has the role of converting the electrode pitch of the pad electrodes 120 into the electrode pitch of the external terminals 340.

Figure 29:
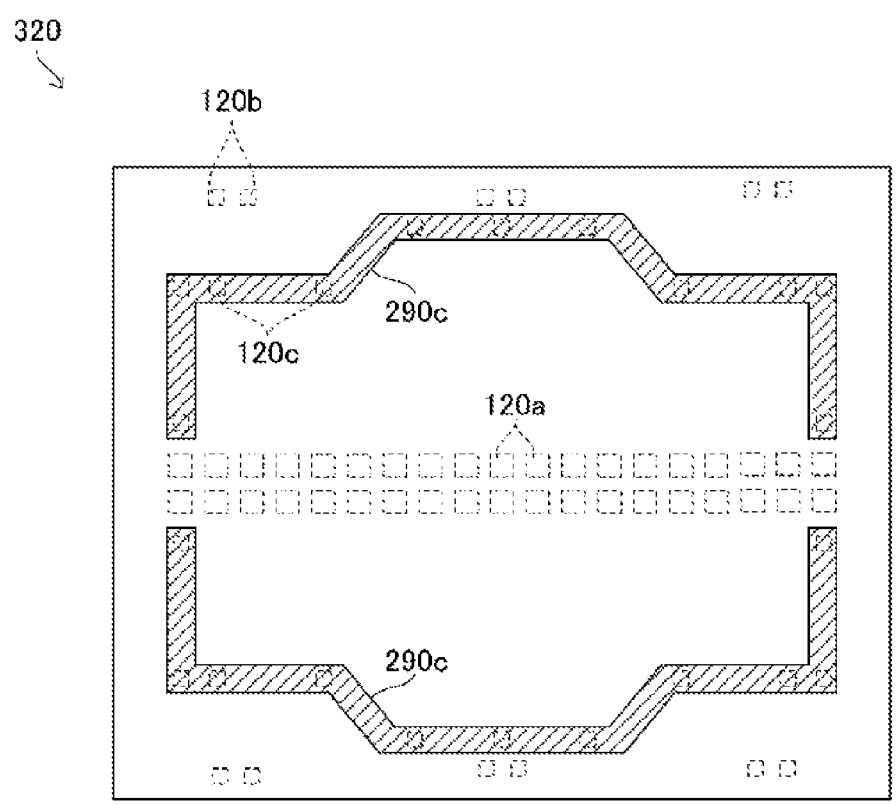
FIG. 29 is a schematic plan view showing the layout of bridge wiring 290c formed in the wiring layer 320.

FIG. 29 is a schematic plan view showing the layout of bridge wiring 290c formed on the wiring layer 320. In FIG. 29, the broken lines indicate the pad electrodes 120a to 120c.

As shown in FIG. 29, the bridge wiring 290c formed on the wiring layer 320 is provided so as to short-circuit the plurality of pad electrodes 120c. In this way, for example the impedance of the wiring supplying the internal power supply voltage VINT can be reduced by the bridge wiring 290c, the same as for the first to fourth embodiments. The bridge wiring 290c is not connected to any of the external terminals 340.

In this way, the semiconductor device according to the present invention is not limited to a structure in which the semiconductor chip is flip chip connected to a rigid wiring substrate, but it can also be applied to a semiconductor device having a so-called wafer level package structure, as described in the fifth embodiment.

In the above, the preferred embodiments of the present invention were described, but the present invention is not limited to the embodiments as described above, and various modifications can be made that do not deviate from the intent of the present invention, and these are also included within the scope of the present invention.

Figure 30:
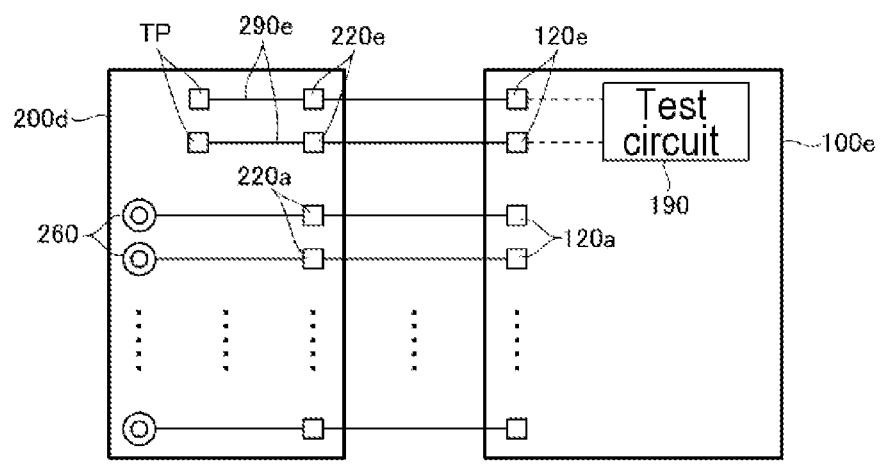
FIG. 30 is a schematic view for describing the connection relationship between the semiconductor chip 100e and the wiring substrate 200d.

For example, in each of the embodiments as described above, examples were described in which the impedance of specific wiring was reduced by short-circuiting the plurality of pad electrodes via the bridge wiring, but the present invention is not limited to this, and as shown in FIG. 30 by connecting specific pad electrodes 120e to connecting electrodes 220e, and by bringing out the wiring 290e on to the wiring substrate 200d, the probing can also be carried out after flip chip connecting. The probing may be directly carried out on the wiring 290e, or it may be carried out on a test pad TP provided on the end of the wiring 290e.

In other words, after flip chip connecting the semiconductor chip 100e to the wiring substrate 200d, it is not possible to carry out probing of the pad electrodes 120 provided on the semiconductor chip 100e, so it is necessary to carry out the operational test via external terminals 260 provided on the wiring substrate 200d. However, it is not possible to monitor pad electrodes 120e that are not connected to the external terminals 260. In order to resolve this problem, as shown in FIG. 30, by bringing out the pad electrodes 120e that are not connected to the external terminals 260 to the wiring 290e on the wiring substrate 200d, probing can be carried out. In the example shown in FIG. 30, a test circuit 190 provided on the semiconductor chip 100e is connected to the pad electrodes 120e, and in this way the test circuit 190 is operated after flip chip connecting, or, a signal or voltage level generated by the test circuit 190 can be monitored.

REFERENCE NUMERALS 10, 20, 40 Semiconductor device
100, 100a, 100b, 100c, 100d, 100e Semiconductor chip
100X Semiconductor chip mounting region
110a to 110d, 110X Bump electrode
111 UBM layer
112 Pillar portion
112a Top end surface of the pillar portion
112b Side surface of the pillar portion
113 Solder layer
120a to 120c, 120e Pad electrode
120X Penetrating electrode
130 Protective film
140 Internal voltage generation circuit
150A, 150B Circuit
160 Resist film
160a, 160c Opening
170a to 170d Reverse surface bump
190 Test circuit
200, 200b, 200d Wiring substrate (wiring structure)
210, 210X Insulating substrate
210a First surface of insulating substrate
210b Second surface of insulating substrate
220a, 220c, 220e Connecting electrode
221 Through hole conductor
230 Land pattern
240 Wiring pattern
241 Power supply pattern
250 Solder resist
260, 340 External terminal
270 Underfill
280 Sealing resin
290, 290a, 290b, 290c Bridge wiring
290e Wiring
300 Wiring structure
310 First insulating film
320 Wiring layer
330 Second insulating film
411 to 413, 421 to 423 Power supply wiring
D Dicing line
M Mask
S Semiconductor substrate
TP Test pad

What is claimed is:

1. A semiconductor device comprising:
a semiconductor chip having a plurality of transistors, a plurality of first pad electrodes and a plurality of second pad electrodes; and
a wiring structure provided on the semiconductor chip, wherein the wiring structure includes a plurality of external terminals, a plurality of wiring patterns that electrically connect the plurality of external terminals and the plurality of first pad electrodes, and bridge wiring that is not electrically connected to any of the plurality of external terminals within the wiring structure, but that electrically connects the plurality of second pad electrodes in a shared fashion.

2. The semiconductor device according to claim 1, wherein a same power supply voltage appears in the plurality of second pad electrodes.

3. The semiconductor device according to claim 2, wherein the semiconductor chip further includes an internal voltage generation circuit that receives an external power supply voltage supplied via the plurality of first pad electrodes and generates an internal power supply voltage, and the internal power supply voltage appears on the plurality of second pad electrodes.

4. The semiconductor device according to claim 2, wherein the same voltage as the external power supply voltage supplied via the plurality of first pad electrodes appears on the plurality of second pad electrodes.

5. The semiconductor device according to claim 1, wherein the area of the plurality of first pad electrodes is greater than the area of the plurality of second pad electrodes.

6. The semiconductor device according to claim 1, wherein the semiconductor chip further includes a plurality of first bump electrodes formed on the plurality of first pad electrodes, and a plurality of second bump electrodes formed on the plurality of second pad electrodes, the wiring structure further includes an insulating substrate, a plurality of first connecting electrodes connected to the plurality of first bump electrodes, and a plurality of second connecting electrodes connected to the plurality of second bump electrodes, the plurality of external terminals is formed on a first surface of the insulating substrate, and the plurality of first and second bump electrodes is formed on a second surface of the insulating substrate, the plurality of wiring patterns electrically connect the plurality of first connecting electrodes and the plurality of external terminals, and the bridge wiring electrically connects the plurality of second connecting electrodes in a shared fashion.

7. The semiconductor device according to claim 6, wherein the plurality of first bump electrodes is disposed in the center region of a main surface of the semiconductor chip, and the plurality of second bump electrodes is disposed in the outer peripheral region of the main surface of the semiconductor chip.

8. The semiconductor device according to claim 7, wherein the plan shape of the plurality of first bump electrodes is square, and the plan shape of the plurality of second bump electrodes is either circular or polygonal in which all the internal angles are obtuse angles.

9. The semiconductor device according to claim 6, wherein each of the plurality of first and second bump electrodes includes a pillar portion standing on the corresponding first or second pad electrode, and a solder layer provided on the top end surface of the pillar portion, and the angle formed between the top end surface of the pillar portion and the side surface in contact with the top end surface is an acute angle.

10. The semiconductor device according to claim 1, wherein the semiconductor chip further includes a plurality of first bump electrodes formed on the plurality of first pad electrodes, and a second bump electrode provided covering two or more of the second pad electrodes included in the plurality of second pad electrodes, and that connects in a shared fashion the two or more second pad electrodes.

11. The semiconductor device according to claim 10, wherein one of the two or more second pad electrodes is provided on first wiring formed on a wiring layer of the uppermost layer of the semiconductor chip, and another one of the two or more second pad electrodes is provided on second wiring formed on the wiring layer of the uppermost layer and at least separated from the first wiring on the wiring layer of the uppermost layer.

12. The semiconductor device according to claim 11, wherein the first wiring and the second wiring are short-circuited by a wiring layer that is different from the wiring layer of the uppermost layer.

13. The semiconductor device according to claim 1, wherein the wiring structure further includes an insulating layer that covers the main surface of the semiconductor chip on which the plurality of first and second pad electrodes is formed, and the plurality of through holes provided penetrating the insulating layer, and in which the plurality of first and second pad electrodes is exposed, and the wiring patterns and the bridge wiring is made from conductors provided on the first insulating layer and within the plurality of through holes.

* * * * *